US008472690B2

(12) United States Patent
Zhao

(10) Patent No.: US 8,472,690 B2
(45) Date of Patent: Jun. 25, 2013

(54) DERIVING A VELOCITY ENCODING ANTI-ALIASING LIMIT TO PREVENT ALIASING AND ACHIEVE AN ADEQUATE SIGNAL-TO-NOISE RATIO IN PHASE CONTRAST MAGNETIC RESONANCE IMAGING

(75) Inventor: Meide Zhao, Oswego, IL (US)

(73) Assignee: VASSOL Inc., River Forest, IL (US)

( * ) Notice: Subject to any disclaimer, the term of this patent is extended or adjusted under 35 U.S.C. 154(b) by 936 days.

(21) Appl. No.: 12/277,889

(22) Filed: Nov. 25, 2008

(65) Prior Publication Data

US 2009/0161934 A1  Jun. 25, 2009

Related U.S. Application Data

(60) Provisional application No. 61/077,266, filed on Jul. 1, 2008, provisional application No. 60/991,374, filed on Nov. 30, 2007.

(51) Int. Cl.
*G06K 9/00* (2006.01)
*G01V 3/00* (2006.01)

(52) U.S. Cl.
USPC .......................................... 382/131; 324/306

(58) Field of Classification Search
USPC ................... 382/128–132, 162–170; 324/307, 324/306, 309, 311, 310; 378/4, 5, 6, 18, 54, 378/56, 86, 207, 901; 250/208.1, 559.04–559.06, 559.19, 559.4, 214.1, 214 R, 250/363.02, 363.04, 363.09

See application file for complete search history.

(56) References Cited

U.S. PATENT DOCUMENTS

| 4,609,872 | A  | * | 9/1986 | O'Donnell ..................... 324/306 |
| 5,783,942 | A  | * | 7/1998 | Bernstein et al. ............. 324/306 |
| 6,408,201 | B1 |   | 6/2002 | Foo |
| 6,683,454 | B2 |   | 1/2004 | Rehwald et al. |
| 6,754,521 | B2 |   | 6/2004 | Prince |
| 6,757,442 | B1 |   | 6/2004 | Avinash |
| 7,162,062 | B2 | * | 1/2007 | Breitenstein et al. ......... 382/128 |
| 2004/0167394 | A1 | | 8/2004 | Assmann |

OTHER PUBLICATIONS

"International Application Serial No. PCT/US2008/013151, Search Report mailed Feb. 5, 2009".

Zhao, M., et al., "Improved phase-contrast flow quantification by three-dimensional vessel localization," *Magnetic Resonance Imaging*, 18 (2000), 697-706.

(Continued)

*Primary Examiner* — Que T Le
*Assistant Examiner* — Jennifer Bennett
(74) *Attorney, Agent, or Firm* — Much Shelist; Michael J. Femal

(57) ABSTRACT

Methods and systems are described for optimizing particular protocol parameters used in phase contrast magnetic resonance (PCMR) imaging. Optimal settings for PCMR protocol parameters such as coordinates, field of view (FOV), frequency/phase encoding lines, number of excitations (NEX), slice thickness, views per segment (VPS), and coil setting may be determined based upon the cut position/orientation of an image containing a vessel of interest, vessel size, length of the vessel segment, and heart rate. An optimal velocity encoding gradient (VENC) for PCMR may also be determined that both avoids aliasing and ensures an adequate signal-to-noise ratio.

16 Claims, 3 Drawing Sheets

OTHER PUBLICATIONS

"European Application Serial No. 08853326.0, European Extended Search Report mailed Mar. 14, 2012", 10 pgs.

"Israeli Application Serial No. 206075, Response filed Jun. 24, 2012 to Office Action mailed Oct. 25, 2012", 2 pgs.

Hoogeveen, Romhild M, et al., "Limits to the Accuracy of Vessel Diameter Measurement in MR Angiography", Journal of Magenetic Resonance Imaging, vol. 8, Jan. 1, 1998), 1228-1235.

Lotz, Joachim, et al., "Cardiovascular Flow Measurement with Phase-Contrast MR Imaging: Basic Facts and Implementation", Radiographics, vol. 22, (Jan. 1, 2002), 651-671.

"Israel Application Serial No. 206075, Examiner Report mailed Dec. 19, 2012", 53 pgs.

\* cited by examiner

| Diameter | FOV | Freq | Phase | Pix_Freq | Pix_Phase | Pixels | NEX |
|---|---|---|---|---|---|---|---|
| 30 | 440 | 256 | 64 | 1.72 | 6.88 | 60 | 2 |
| 28 | 440 | 256 | 64 | 1.72 | 6.88 | 52 | 2 |
| 26 | 440 | 256 | 64 | 1.72 | 6.88 | 45 | 2 |
| 24 | 400 | 256 | 64 | 1.56 | 6.25 | 46 | 2 |
| 22 | 400 | 256 | 64 | 1.56 | 6.25 | 39 | 2 |
| 20 | 400 | 256 | 64 | 1.56 | 6.25 | 32 | 2 |
| 18 | 320 | 256 | 64 | 1.25 | 5.00 | 41 | 2 |
| 16 | 320 | 256 | 128 | 1.25 | 2.50 | 64 | 2 |
| 14 | 320 | 256 | 128 | 1.25 | 2.50 | 49 | 2 |
| 12 | 320 | 256 | 128 | 1.25 | 2.50 | 36 | 2 |
| 10 | 200 | 256 | 128 | 0.78 | 1.56 | 64 | 2 |
| 9 | 200 | 256 | 128 | 0.78 | 1.56 | 52 | 2 |
| 8 | 200 | 256 | 128 | 0.78 | 1.56 | 41 | 2 |
| 7 | 160 | 256 | 128 | 0.63 | 1.25 | 49 | 4 |
| 6 | 160 | 256 | 128 | 0.63 | 1.25 | 36 | 4 |
| 5 | 140 | 256 | 160 | 0.55 | 0.88 | 41 | 4 |
| 4 | 140 | 256 | 192 | 0.55 | 0.73 | 32 | 4 |
| 3 | 120 | 256 | 192 | 0.47 | 0.63 | 24 | 4 |
| 2 | 120 | 384 | 384 | 0.31 | 0.31 | 32 | 4 |
| 1.5 | 120 | 512 | 512 | 0.23 | 0.23 | 32 | 4 |

Fig. 3

DERIVING A VELOCITY ENCODING ANTI-ALIASING LIMIT TO PREVENT ALIASING AND ACHIEVE AN ADEQUATE SIGNAL-TO-NOISE RATIO IN PHASE CONTRAST MAGNETIC RESONANCE IMAGING

RELATED APPLICATIONS

This application is based upon, and claims priority to, previously filed provisional application Ser. No. 60/991,374, filed on Nov. 30, 2007, and previously filed provisional application Ser. No. 61/077,266, filed on Jul. 1, 2008. The provisional applications are hereby incorporated by reference.

This application is also related to U.S. Pat. Nos. 7,191,110; 7,739,090; 8,000,768; 7,739,090 and 7,515,742 U.S. Publication No. 2008/0146951 and U.S. patent application Ser. No. 11/771,047 (now abandoned), the disclosures of which are incorporated by reference in their entirety.

BACKGROUND

In magnetic resonance imaging, the spins of specific nuclei (usually hydrogen nuclei) in a tissue are excited by radiofrequency (RF) pulses in the presence of an applied static magnetic field in a selected direction, the magnitude of which is made to spatially vary in a defined time sequence. The precessional frequencies of the excited spins vary in relation to the magnitude of the applied magnetic field and thereby produce a precessional signal from which the spatial locations of the spins can be derived. By applying one or more excitation RF pulses and a specific sequence of linear spatial variations in the applied magnetic field, referred to as gradient pulses, the resulting precessional signal can be interpreted as a carrier waveform amplitude modulated by the Fourier transform of the spatial distribution of spin density in a selected portion of the tissue. The carrier waveform in this case is a complex sinusoid at the spin resonance frequency with no gradient applied (i.e., the Larmor frequency of the spin species). Transformation from the spatial frequency domain, referred to as k-space, to the image position domain can be accomplished by inverse Fourier transforming the k-space signal which is generated after demodulation of the precessional signal. The k-space signal is thereby transformed to a spin density function in position space which can be used to generate an image where the intensity of an image pixel varies in accordance with the magnitude of the spin density function at the pixel location. In order to image a selected volume of interest (VOI) in the body, an MRI data set is acquired which is made up of a plurality of slices derived from a two-dimensional (2D) spin density function or a plurality of slabs derived from a three-dimensional (3D) spin density function. As the term is used herein, "image" should be taken to mean either an actual visual representation or the data from which such a representation could be rendered. Similarly, a "pixel" or "voxel" should be taken to mean either a discrete element of an actual 2D or 3D visual representation, respectively, or the corresponding element of a 2D or 3D object from which such a representation could be rendered.

The time sequence of RF excitation and gradient pulses may be manipulated so that the spin density function derived from the k-space signal is dependent upon other parameters in addition to spin density, such as the spin-lattice relaxation time constant $T_1$ or the spin-spin relaxation time constant $T_2$. The time constant $T_1$ relates to the time required for spins to recover longitudinal magnetization after an excitation pulse, the longitudinal magnetization being necessary for the generation of an FID (free induction decay) signal following an excitation pulse. A pulse sequence may be designed so that spins with a shorter $T_1$ are weighted more heavily in the spin density function, and a so-called $T_1$ weighted image may be derived from such a spin density function. The time-of-flight (TOF) method of imaging blood flow in tissue involves the use of repeated excitation pulses timed so that blood flowing from an unexcited region into the region excited by the pulses has a greater longitudinal magnetization than the stationary tissue in the excited region. The moving blood thus mimics a tissue with a short $T_1$ and produces an enhanced spin signal. TOF imaging may be used to selectively image blood vessels owing to the moving blood contained within the vessels.

Blood flow may be imaged and quantified by another technique, phase contrast magnetic resonance (PCMR). The k-space signal from the excited spins is a complex signal in which the real and imaginary components modulate the carrier waveform in phase quadrature. Ideally, inverse Fourier transformation of the k-space signal results in a purely real spin density function. Certain artifacts may cause the spin density function to have both real and imaginary parts, but this problem can be circumvented in normal imaging by varying the image pixel or voxel intensity in accordance with the magnitude of the spin density function to create a so-called magnitude image. In PCMR, on the other hand, a bipolar gradient pulse is used to cause flowing spins to acquire a phase which is proportional to the velocity of the spins in the direction of the gradient. After such phase-encoding of velocity, the phase can be extracted from the spin density function to measure the magnitude of blood flow. The extracted phase can also be used to construct an image where the pixel or voxel intensity varies with the phase of the spin density function at the location of the pixel or voxel, called a phase image. A phase image derived from a k-space signal derived after application of an appropriate through-plane bipolar gradient pulse, for example, can provide a visual representation of the magnitude of blood flow through the plane of the image.

BRIEF DESCRIPTION OF THE DRAWINGS

FIG. 3 illustrates an exemplary scheme for generation of optimal PCMR protocol parameters.

DETAILED DESCRIPTION

Figure 1:
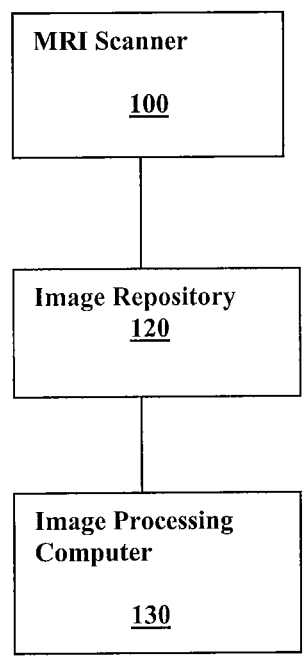
FIG. 1 depicts an exemplary system for implementing the described techniques.

In order to generate a spin density function from which a phase or magnitude image may be derived, a sequence of RF pulses and magnetic field gradients is applied to cause an FID precessional signal that may then be sampled to yield a k-space representation of a particular volume of interest. In a typical 2D imaging sequence, an RF pulse is applied along with a slice select gradient pulse, where the frequency of the RF pulse is at the Larmor frequency of the combined static magnetic field and the gradient field. The result is excitation of a layer of spins with a slice thickness TH determined by the bandwidth of the RF pulse. The positions of the spins are encoded in two orthogonal directions by gradient pulses orthogonally oriented to each other and to the slice select gradient. A gradient pulse applied when the precessional signal is sampled is referred to as a frequency encoding gradient, and the direction of the frequency encoding gradient is referred to as the read direction. A gradient pulse applied for period of time prior to the sampling is a phase encoding gradient with the direction of the gradient referred to as the phase encoding direction. By sampling multiple FID precessional signals with phase encoding gradient pulses of varying amplitudes, the entire 2D k-space may be covered. In 3D imaging, additional gradient pulses in the slice select direction are also applied so as to encode the spin positions across the thickness of the slice. Described below are methods for optimizing particular protocol parameters used in PCMR imaging.

Determination of Initial PCMR Parameters

In a PCMR study, a cross-sectional plane corresponding to a desired cut through the patient's anatomy is imaged with either 2D or 3D imaging sequences. The pixels corresponding to locations within one or more blood vessels are then identified. The same anatomical region may also be imaged with a TOF technique to aid in this process. In order to perform PCMR, protocol parameters such as coordinates, field of view (FOV), frequency/phase encoding lines, number of excitations (NEX), slice thickness, views per segment (VPS), and coil setting must be determined. As described below, optimal settings for some of these parameters may be derived based on the cut position/orientation, vessel size, length of the vessel segment, and heart rate.

The precessional signal is collected as a series of samples representing k-space in both the read direction and the phase encoding directions. The spacing between the k-space points is generally made to be uniform by making the time between samples of the precessional signal equal and by making equally stepped changes in the magnitude of the phase encoding gradient as the imaging sequence is repeated to cover k-space. Because the resulting two-dimensional k-space signal is discrete, the spin density function derived from inverting the k-space signal repeats itself over a certain spatial interval referred to as the field of view or FOV. The FOV in the read direction is the reciprocal of the k-space spacing in that direction and is determined by the sampling frequency. The FOV in the phase encoding direction is the reciprocal of the k-space spacing in that direction and is determined by the spacing between the magnitudes of successive phase encoding gradients. The pixel resolution in the read direction is then the FOV in that direction divided by the number of frequency encoding lines in k-space (i.e., the number of samples collected during each imaging sequence). The pixel resolution in the phase encoding direction is then the FOV in that direction divided by the number of phase encoding lines in k-space (i.e., the number of different phase encoding gradient pulses applied during the imaging sequences). In one embodiment, the diameter of a vessel of interest is determined from, for example, a TOF image. A desired number of pixels to be contained within the vessel of interest for optimal PCMR flow quantification is then determined. The FOV, number of frequency encoding lines, and number of phase encoding lines are then selected for PCMR in a manner that results in a pixel resolution so that the desired number of pixels are contained within the vessel of interest.

FIG. 3 is a table that illustrates exemplary PCMR protocol parameters as derived for a number of different vessel diameters. The objective is to set the protocol parameters so that a desired number of pixels are contained within the vessel of interest. A TOF image of the volume of interest is obtained prior to PCRM imaging, and the cut position/orientation of the TOF image is derived therefrom according to the imaging specification for geometrical information. The diameter of a vessel of interest is estimated from vessel segmentation of TOF images. Such segmentation and vessel measurement may be performed automatically by image processing software or manually from the TOF images. The vessel diameter is then used to determine the MR parameters, such as field of view (FOV), frequency encoding lines (Freq), phase encoding lines (Phase), and number of excitations (NEX). The number of excitations refers to the number of times an FID signal is generated and sampled for each particular phase encoding gradient in order to perform signal averaging for purposes of noise reduction. In the table of FIG. 3, "Pix_Freq" and "Pix_Phase" are pixel resolutions determined by FOV/Freq and FOV/Phase respectively, and "Pixels" is an approximate number of pixels within the vessel. In this example, "FOV", "Freq", and "Phase" are selected so that the value of "Pixels" is between 30 and 70.

The centerline of a vessel may also be calculated using the TOF images. A line-fitting algorithm executed by the image processor is used to fit the centerline to line segments. The maximum length of the line segments defines the straightness. The thickness TH of the imaging slice is then determined by the straightness of the vessel. In an exemplary embodiment, the thickness TH is set to 3 mm if the straightness is between 3 mm and 5 mm, set to 4 mm if the straightness is between 5 mm and 7 mm, set to 5 mm if the straightness is between 7 mm and 10 mm, and set to 7 mm if the straightness is over 10 mm.

In cardiac gated imaging, the PCMR imaging sequences are triggered synchronously with the cardiac cycle as determined from an electrocardiogram. The "views per segment" (VPS) is the number of excitation sequences during each cardiac cycle. The optimal VPS may be determined from the heart rate of the patient. In an exemplary embodiment, the VPS is set to 4 if the heart rate is over 120, the VPS is set to 8 if heart rate is between 90 and 120, and the VPS is set to 16 if heart rate is less than 90.

The coil setting may be set to be the same as used for TOF imaging. Other parameters such as "flip angle", "bandwidth", "number of cardiac phases", "imaging option", and "pulse sequence" may be fixed values with TR/TE set to minimal. The velocity encoding anti-aliasing limit may be set to an initial value (e.g., as derived from averages of maximum peak velocity from baseline studies) or calculated from an "auto VENC" algorithm as described below.

Determination of Velocity Encoding Anti-Aliasing Limit

In blood flow analyses using PCMR, a bipolar gradient pulse of magnitude G may be applied to cause spins flowing with a constant velocity v in the direction of the gradient to acquire a phase φ as determined by the following relation:

$$\phi = \gamma G v \tau^2$$

where γ is the gyromagnetic ratio and τ is the width of each lobe of the bipolar gradient pulse. The above relation thus maps the phase of a spin density function as depicted in a PCRM image to a velocity. If phase shifts due to moving spins were the only source of phase in a phase image, the above relation could be used to calculate flow velocities for each pixel in the image. Inhomogeneities in the applied magnetic field (and other factors), however, can impart background phases to particular spins in the phase image. These background phases can be eliminated by constructing two phase images with bipolar gradient pulses of equal magnitude and opposite polarity and then subtracting one phase image from the other. Because the background phases are independent of the bipolar gradient pulses, the result of the subtraction is a phase image with velocity dependent phase information and without the background phases.

For precise measurements of blood flow, it is desirable for the phase signal to be as high as possible in order to differentiate such signals from phase noise. That is, a high signal-tonoise ratio (SNR) is desired. From the relation between the phase $\phi$ imparted to flowing spins and the magnitude G of the bipolar gradient pulse given above, it is seen that the magnitude of the phase signal increases proportionately with the gradient magnitude G. Increasing G beyond a certain point, however, results in distortion of the phase image due to aliasing. When the velocity of a pixel results in phase exceeding 180 degrees, the phase of that pixel in the phase image is aliased back to a phase between −180 degrees and +180 degrees. Such aliasing distortion will occur when the velocity and gradient magnitude are related by:

$$\phi = \gamma G v \tau^2 > 180 \text{ degrees}$$

The spin velocity above which aliasing occurs is referred to as the velocity encoding anti-aliasing limit or VENC and is given by:

$$VENC = 180/\gamma G\tau^2$$

The VENC is thus the aliasing velocity, the highest velocity that can be unambiguously represented in the PCMR image. As a spin velocity increases above the VENC, the phase increases above 180 degrees, and the corresponding velocity to which the phase is mapped is aliased to a velocity in the opposite direction.

Described herein is a method and system that automatically determines an appropriate VENC for PCMR imaging. As noted above, the selection of the VENC affects the SNR of the phase images and the accuracy of the flow measurements derived therefrom. The velocity of blood flow in vessels varies depending on the size of a vessel, type of vessel (artery or vein), and terminal resistances. If the VENC used is lower than the maximum peak velocity (MPV) of the blood flow within the imaged region (i.e., the peak velocity during the cardiac cycle of the pixel within the imaged region having the maximum velocity), velocity aliasing artifact will appear in PCMR images. On the other hand, if the VENC used is too high relative to the maximum peak velocity, the SNR of PCMR images will be inadequate for flow quantification. The approach described herein provides automatic VENC determination for PCMR flow quantification.

In one embodiment, an initial VENC value is used to scan a selected vessel using a selected PCMR protocol. The acquired PCMR images are then processed to calculate volumetric flow rates and peak velocities. The peak velocities are then used to detect if the initial VENC is appropriate or not. If it is, the flow results will be accepted. If it is not, a VENC value calculated from the peak velocities will be used to rescan the vessel. The initial VENC value can be different from vessel to vessel and can be based on the mean of previous maximum velocity measurements. After the PCMR images are acquired, the vessel borders may be extracted automatically or manually modified through a GUI interface. There are three scenarios that can automatically be detected based on the portion(s) of the PCMR image within the borders of a vessel: velocity aliasing due to a VENC that is too low, inadequate SNR due to a VENC that is too high, and an acceptable measurement. If the result is not an acceptable measurement, the vessel is rescanned with a new VENC that is automatically calculated.

Aliasing in a PCMR image can be detected if two or more neighboring pixels contained within a vessel border exhibit velocities of different signs. Such pixels exhibiting this kind of discontinuity can be assumed to be aliased. It may also be required for the magnitude of the velocity difference between the pixels to be equal to or greater than the VENC in order for aliasing to be found. In order to determine the actual maximum peak velocity represented by the aliased pixels, referred to herein as the corrected maximum peak velocity, the velocity represented by the maximally aliased pixel is subtracted from twice the VENC:

Corrected MPV=2*VENC−velocity of maximally aliased pixel

Velocity aliasing correction may then be performed by multiplying the corrected MPV by a factor K to compute in a new VENC, where the value of K is chosen to result in a desired balance between preventing aliasing and achieving an adequate SNR . . . (e.g., 1.5). If no velocity aliasing is found, the maximum peak velocity will be the maximum of the pixel velocities within the vessel borders for all the PCMR images in a cardiac cycle. If the maximum peak velocity is equal to or less than a specified percentage of the initial VENC (e.g., 20%), the initial VENC may be considered as too high to provide an adequate SNR; otherwise it is an acceptable measurement. If the VENC is too high, the new VENC value may be computed as the multiplication of the maximum peak velocity and a factor K (e.g., 1.5).

Exemplary Embodiment

FIG. 1 illustrates an exemplary system that may used to implement the methods described herein. One system component is an MRI scanner 100 that includes a main magnet, gradient coils, RF coils, RF electronics, gradient amplifiers, pulse sequence computer, and an image reconstruction computer. The MRI scanner generates images and communicates the images to an image repository 120. An image processing computer 130 retrieves selected images from the image repository and is programmed to process the images using the methods described herein. The image processing computer may include an input device (e.g., keyboard) and a device for displaying the processed images to a user (e.g., a monitor). The illustrated system is for example purposes only, and other embodiments may distribute the processing of the steps described herein differently.

Figure 2:
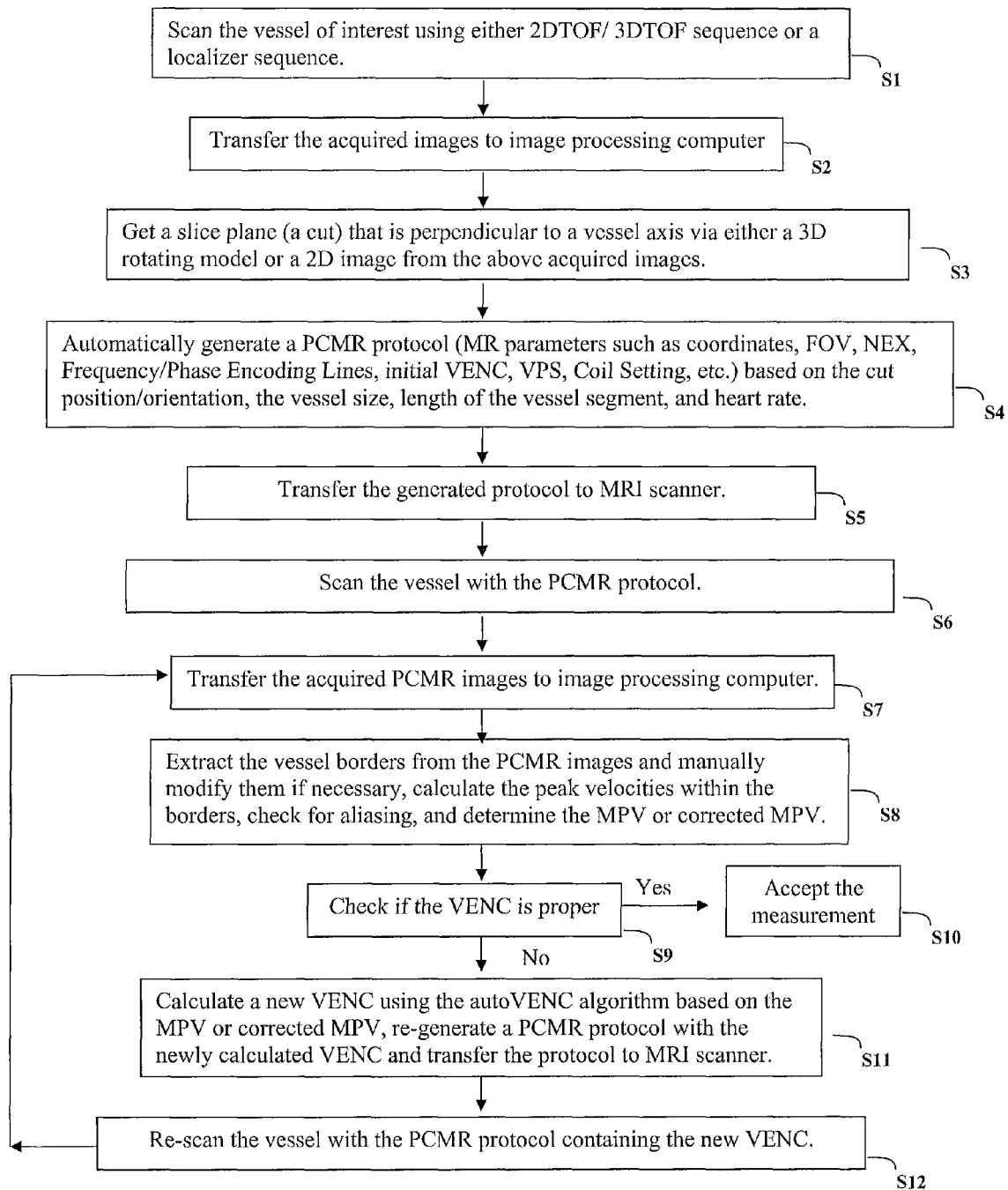
FIG. 2 illustrates an exemplary algorithm for automatically determining the velocity encoding anti-aliasing limit.

FIG. 2 illustrates an exemplary algorithm that could be executed by the image processing computer and/or MRI scanner. At step S1, the vessel of interest is scanned using either 2D or 3D TOF sequence or a localizer sequence performed without or with contrast medium and/or breath hold. The acquired images are transferred to the image processing computer at step S2. A slice plane (i.e., a cut) that is perpendicular to the selected vessel axis is selected via either a 3D rotating model or a 2D image from the above acquired images on the image processing computer at step S3. At step S4, a PCMR protocol (MR parameters such as coordinates, FOV, NEX, Frequency/Phase Encoding Lines, initial VENC, VPS, Coil Setting, etc.) is generated based on the cut position/orientation, the vessel size, length of the vessel segment, and heart rate. At step S5, the generated protocol is transferred to the MRI scanner. The vessel is then scanned with the PCMR protocol transferred from the image processing computer at step S6, and the acquired PCMR images are transferred back to the image processing computer at step S7. At step S8, the vessel borders are extracted automatically or manually from the PCMR images and manually modified if necessary. The peak velocities within the borders are calculated, a check for aliasing is made, and the maximum peak velocity MPV or corrected MPV (if aliasing is present) is determined. A check to see if the VENC is proper is made at step S9. If the VENC is proper, the measurement is accepted at step S10. Otherwise, at step S11, a new VENC is calculated using the autoVENC algorithm based on the maximum peak velocity or corrected maximum peak velocity, a PCMR protocol with the newly calculated VENC is generated, and the new protocol is transferred to the MRI scanner. The vessel is then re-scanned with the PCMR protocol containing the new VENC at step S12, and a return is made to step S7. Steps S7 through S12 may be iterated as necessary.

An exemplary embodiment of the aliasing checking and autoVENC algorithm performed at steps S8 through S12 is as follows, designated as steps a through e:

(a) A PCMR image of one or more selected blood vessels is generated using a selected PCMR protocol that includes a selected VENC.

(b) A determination is made whether or not aliasing is present by detecting if velocity discontinuities exist between two or more neighboring pixels located within a blood vessel of the PCMR image. Aliasing is assumed to be present if any pixels within a blood vessel have velocities in opposite directions and a magnitude difference equal to or greater than the VENC.

(c) If aliasing is present, a corrected maximum peak velocity in the PCMR image is computed from a pixel in the PCMR image whose phase is maximally aliased. A new VENC is derived as the corrected maximum peak velocity multiplied by a factor K, and a return is made to step (a). If no aliasing is found, the algorithm could simply continue to operate with the VENC currently being used. Preferably, however, the algorithm checks the VENC against the maximum peak velocity in order to adjust the VENC for an optimum signal-to-noise ratio as in the following steps (d) and (e).

(d) If no aliasing is found to be present, the maximum peak velocity in the PCMR image is found, the maximum peak velocity is compared to the VENC, and the PCMR image is accepted as proper if the maximum peak velocity does not exceed a specified percentage of the VENC; and (e) If the PCMR image is not accepted as proper at step (d), a new VENC is computed as the maximum peak velocity multiplied by a factor K, and a return is made to step (a).

The invention has been described in conjunction with the foregoing specific embodiments. It should be appreciated that those embodiments may also be combined in any manner considered to be advantageous. The described embodiments may also be used in conjunction with any of the methods or systems described in the aforementioned U.S. Pat. No. 7,191,110 or U.S. patent application Ser. Nos. 11/324,126, 11/032,306, 11/324,126, 11/771,047, 11/858,424, and 11/771,062. Also, many alternatives, variations, and modifications will be apparent to those of ordinary skill in the art. Other such alternatives, variations, and modifications are intended to fall within the scope of the following appended claims.

What is claimed is:

1. A method for operating an magnetic resonance imaging (MRI) scanner, comprising:
    acquiring a phase contrast magnetic resonance (PCMR) image of a blood vessel of interest in a subject using a selected PCMR protocol that includes a selected velocity encoding anti-aliasing limit (VENC);
    determining whether or not aliasing is present by detecting if one or more velocity discontinuities exist between two or more neighboring pixels located within the PCMR image of the blood vessel; and,
    if aliasing is determined to be present, computing a corrected maximum peak velocity (MPV) in the PCMR image from a pixel in the PCMR image whose phase is maximally aliased from the following formula:

corrected MPV=2*VENC−velocity of maximally aliased pixel;

deriving a new VENC as the corrected maximum peak velocity multiplied by a factor K whose value is selected to both event aliasing and achieve an adequate signal-to-noise ratio (SNR); and,
    repeating the acquisition of the PCMR image of the blood vessel using the new VENC.

2. The method of claim 1 further comprising:
    generating a time-of-flight (TOF) image that includes the blood vessel of interest;
    measuring the diameter of the vessel of interest from the TOF image;
    selecting a desired number of pixels to be contained within the vessel of interest in the (PCMR) image;
    setting a field of view (FOV), number of frequency encoding lines, and number of phase encoding lines for PCMR in a manner that results in a pixel resolution so that the desired number of pixels are contained within the vessel of interest.

3. The method of claim 2 further comprising:
    calculating a centerline of the vessel of interest using the TOF images;
    executing a line-fitting algorithm to fit the centerline to line segments where the maximum length of the line segments defines a straightness of the vessel of interest; and,
    setting a thickness parameter TH of the imaging slice in accordance with the straightness of the vessel of interest.

4. The method of claim 3 further comprising:
    setting the thickness TH to 3 mm if the straightness is between 3 mm and 5 mm;
    setting the thickness TH to 4 mm if the straightness is between 5 mm and 7 mm;
    setting the thickness TH to 5 mm if the straightness is between 7 mm and 10 mm; and,
    setting the thickness TH to 7 mm if the straightness is over 10 mm.

5. The method of claim 1 further comprising:
    generating the PCMR images with cardiac gated imaging in which PCMR imaging sequences are triggered synchronously with the cardiac cycle as determined from an electrocardiogram; and,
    setting an optimal views per segment VPS from a measured heart rate, where the VPS is the number of excitation sequences during each cardiac cycle, by setting the VPS to 4 if the heart rate is over 120, setting the VPS to 8 if heart rate is between 90 and 120, and setting the VPS to 16 if heart rate is less than 90.

6. The method of claim 1 wherein the value of K is selected as 1.5.

7. The method of claim 6 further comprising:
    if no aliasing is found to be present, determining the maximum peak velocity in the PCMR image, comparing the maximum peak velocity to the VENC, and accepting the PCMR image as proper if the maximum peak velocity does not exceed a specified percentage of the VENC; and
    if the PCMR image is not accepted as proper because the maximum peak velocity does exceeds the specified percentage of the VENC, computing a new VENC as the maximum peak velocity multiplied by a factor K, and repeating the acquisition of the PCMR image of the blood vessel.

8. The method of claim 6 further comprising determining whether or not aliasing is present by detecting if any neighboring pixels within a blood vessel have velocities in opposite directions and a magnitude difference equal to or greater than the VENC.

9. A system, comprising:
a magnetic resonance imaging (MRI) scanner;
an image processing computer configured to receive images generated by the MRI scanner, wherein the image processing computer and/or MRI scanner are programmed with instructions for performing the following steps:
acquiring a phase contrast magnetic resonance (PCMR) image of a blood vessel of interest in a subject using a selected PCMR protocol that includes a selected velocity encoding anti-aliasing limit (VENC);
determining whether or not aliasing is present by detecting if one or more velocity discontinuities exist between two or more neighboring pixels located within the PCMR image of the blood vessel; and,
if aliasing is determined to be present, computing a corrected maximum peak velocity (MPV) in the PCMR image from a pixel in the PCMR image whose phase is maximally aliased from the following formula:

corrected MPV=2*VENC−velocity of maximally aliased pixel;

deriving a new VENC as the corrected maximum peak velocity multiplied by a factor K whose value is selected to both prevent aliasing and achieve an adequate signal-to-noise ratio (SNR); and,
repeating the acquisition of the PCMR image of the blood vessel using the new VENC.

10. The system of claim 9 wherein the image processing computer and/or MRI scanner are programmed to
generate a time-of-flight (TOF) image that includes the blood vessel of interest;
measure the diameter of the vessel of interest from the TOF image;
set a field of view (FOV); number of frequency encoding lines, and number of phase encoding lines for PCMR in a manner that results in a pixel resolution so that a specified number of pixels are contained within the vessel of interest.

11. The system of claim 10 wherein the image processing computer and/or MRI scanner are programmed to:
calculate a centerline of the vessel of interest using the TOF images;
execute a line-fitting algorithm to fit the centerline to line segments where the maximum length of the line segments defines a straightness of the vessel of interest; and,
set a thickness parameter TH of the imaging slice in accordance with the straightness of the vessel of interest.

12. The system of claim 11 wherein the image processing computer and/or MRI scanner are programmed to:
set the thickness TH to 3 mm if the straightness is between 3 mm and 5 mm;
set the thickness TH to 4 mm if the straightness is between 5 mm and 7 mm;
set the thickness TH to 5 mm if the straightness is between 7 mm and 10 mm; and,
set the thickness TH to 7 mm if the straightness is over 10 mm.

13. The system of claim 9 wherein the image processing computer and/or MRI scanner are programmed to:
generate the PCMR images with cardiac gated imaging in which PCMR imaging sequences are triggered synchronously with the cardiac cycle as determined from an electrocardiogram; and,
set an optimal views per segment VPS from a measured heart rate, where the VPS is the number of excitation sequences during each cardiac cycle, by setting the VPS to 4 if the heart rate is over 120, setting the VPS to 8 if heart rate is between 90 and 120, and setting the VPS to 16 if heart rate is less than 90.

14. The system of claim 9 wherein the image processing computer and/or MRI scanner are further programmed with the value of K selected as 1.5.

15. The system of claim 9 wherein the image processing computer and/or MRI scanner are programmed with instructions for performing the following steps:
if no aliasing is found to be present, determining the maximum peak velocity in the PCMR image, comparing the maximum peak velocity to the VENC, and accepting the PCMR image as proper if the maximum peak velocity does not exceed a specified percentage of the VENC; and
if the PCMR image is not accepted as proper because the maximum peak velocity does exceeds the specified percentage of the VENC, computing a new VENC as the maximum peak velocity multiplied by a factor K, and repeating the acquisition of the PCMR image of the blood vessel.

16. The system of claim 14 wherein the image processing computer and/or MRI scanner are programmed to determine whether or not aliasing is present by detecting if any neighboring pixels within a blood vessel have velocities in opposite directions and a magnitude difference equal to or greater than the VENC.

* * * * *